US009196600B2

(12) United States Patent
Horng

(10) Patent No.: US 9,196,600 B2
(45) Date of Patent: Nov. 24, 2015

(54) DEVICE AND METHOD FOR CHIP PRESSING

(75) Inventor: Chih-Horng Horng, Hsinchu (TW)

(73) Assignee: Ableprint Technology Co., Ltd., Hsinchu (TW)

(*) Notice: Subject to any disclaimer, the term of this patent is extended or adjusted under 35 U.S.C. 154(b) by 560 days.

(21) Appl. No.: 13/585,773

(22) Filed: Aug. 14, 2012

(65) Prior Publication Data
US 2013/0240115 A1 Sep. 19, 2013

(30) Foreign Application Priority Data

Mar. 13, 2012 (TW) .............................. 101108506 A

(51) Int. Cl.
 *B30B 15/34* (2006.01)
 *H01L 23/00* (2006.01)
(52) U.S. Cl.
 CPC ................ *H01L 24/75* (2013.01); *H01L 24/83* (2013.01); *H01L 2224/2919* (2013.01); *H01L 2224/32225* (2013.01); *H01L 2224/753* (2013.01); *H01L 2224/7598* (2013.01); *H01L 2224/75252* (2013.01); *H01L 2224/83203* (2013.01); *H01L 2224/83209* (2013.01); *H01L 2224/83862* (2013.01)
(58) Field of Classification Search
 CPC ............................................ H01L 2224/83203

USPC ........... 156/64, 351, 358, 359, 366, 367, 368, 156/378, 381, 382, 580, 583.1; 100/48, 50
See application file for complete search history.

(56) References Cited

U.S. PATENT DOCUMENTS

| 5,578,159 | A | * | 11/1996 | Miyashita et al. ............. 156/358 |
| 5,772,835 | A | * | 6/1998 | Jordan et al. .................. 156/358 |
| 7,803,661 | B2 | | 9/2010 | Kim |
| 2008/0268571 | A1 | | 10/2008 | Kim |
| 2009/0137084 | A1 | * | 5/2009 | Kida ............................. 438/107 |

FOREIGN PATENT DOCUMENTS

KR 20080095375 10/2008

* cited by examiner

*Primary Examiner* — George Koch
(74) *Attorney, Agent, or Firm* — Martine Penilla Group, LLP

(57) ABSTRACT

Disclosed are embodiments related to chip pressing devices. One such chip pressing device includes a bottom portion and a top portion, which is configured to be attached to or separated from the bottom portion, and has a compartment portion, an upper chamber, and a lower chamber, wherein the upper chamber is spaced apart from the lower chamber by the compartment portion. The upper chamber has one or more gas passages, the lower chamber has one or more gas inlets and one or more gas outlets, and the compartment portion has one or more through-holes. One or more pressing heads movably fit into the through-holes; one or more gas pressure sources connected to at least one of the gas passages of the upper chamber, wherein the upper chamber is pressurized, and one or more heated gas sources are connected to the one or more gas inlets of the lower chamber.

39 Claims, 4 Drawing Sheets

DEVICE AND METHOD FOR CHIP PRESSING

CROSS-REFERENCE TO RELATED APPLICATION

This application claims the priority benefit of Taiwan Application Serial No. 101108506, filed on Mar. 13, 2012. All disclosure thereof is incorporated herein by reference.

BACKGROUND OF THE INVENTION

A. Field of the Invention

This invention relates to a pressing device and method, more particularly relates to a chip pressing device and method B. Description of the Prior Art During chip packaging, various methods are adopted to join a chip and a carrier. One of these methods is to use a die bonder to accomplish the chip bonding process. While performing chip bonding of this kind, pressure and temperature are frequently applied to the chip to apply a layer of adhesive between the chip and the carrier. In a conventional die bonder, pressing force and temperature for bonding the chip to the carrier are provided by a chip suction head. The die bonder often utilizes mechanical pressurization to attach the chip tightly to the carrier, and heats the chip through thermal conduction of the chip suction head heated by a heating coil or an electric heating pipe. However, conventional die bonders utilizing the above pressurizing and heating method suffer from the following disadvantages: the mechanism is complicated; it is not able to uniformly and fast heat or cool a chip and a carrier at the same time; and a chip suction head tends to be deformed or damaged after undergoing long-term heating.

SUMMARY OF THE INVENTION

In order to solve the above conventional problems, the invention provides a chip pressing device and method, which can perform a fast pressing process for a plurality of chips at a time and have a low cost.

Generally, the invention makes a pressing head under gas pressure apply pressure to a chip on a carrier by gas pressurization. Besides, the invention makes gas at a predetermined temperature heat/cool the chip and the carrier by gas convection.

The advantages of controlling force exertion of the pressing head by gas pressurization include, but not limited to: the chip pressing mechanism gets simplified through using a single gas pressure source to control force exertion of multiple sets of pressing heads. Therefore, the manufacturing cost, including equipments, process time, etc., can be substantially reduced, and the throughput can be improved. The advantages of heating or cooling the chip and the carrier by gas convection include, but not limited to: the heating or cooling can be more uniform; and multiple chips can be heated or cooled quickly—which thus also have the effect of reducing the manufacturing cost.

In one embodiment, the invention provides a chip pressing device, comprising: a bottom portion; a top portion, which is configured to be attached to or separated from the bottom portion, and has a compartment portion, an upper chamber, and a lower chamber, wherein the upper chamber is spaced apart from the lower chamber by the compartment portion, the upper chamber having one or more gas passages, the lower chamber having one or more gas inlets and one or more gas outlets, the compartment portion having one or more through-holes; one or more pressing heads, which is configured to movably fit into the through-hole; one or more gas pressure sources, connected to at least one of the gas passages of the upper chamber, wherein the upper chamber is pressurized through the gas passage connected to the gas pressure source; and one or more heating gas sources, connected to the one or more gas inlets of the lower chamber, wherein when the bottom portion and the top portion are attached to each other, the bottom portion tightly seals the lower chamber of the top portion.

In another embodiment, a chip pressing method provided by the invention utilizes the aforementioned chip pressing device, the method comprising: placing a carrier, which carries one or more chips, on the bottom portion of the chip pressing device; engaging the bottom portion with the top portion of the chip pressing device to make the pressing head contact the chip on the carrier; introducing pressurized gas into the upper chamber through the gas pressure source to perform pressurization, so as to apply pressure to the pressing head to press the chip tightly to the carrier or another chip; and introducing heating gas into the lower chamber through the heating gas source to heat the chip and the carrier.

Other aspects and advantages of the invention will become apparent by reference to the following detailed description combined with the appended drawings for illustrating the principle examples of the invention. In addition, well-known devices and principles are not further described in the specification so as not to unnecessarily obscure the invention.

DETAILED DESCRIPTION OF THE PREFERRED EMBODIMENTS

For the following defined terms, these definitions shall be applied, unless a different definition is given in the claims or elsewhere in this specification. All numeric values are herein defined as being modified by the term "about," whether or not explicitly indicated. The term "about" generally refers to a range of numbers that a person of ordinary skill in the art would consider equivalent to the stated value to produce substantially the same properties, function, result, etc.

A numerical range indicated by a low value and a high value is defined to include all numbers subsumed within the numerical range and all subranges subsumed within the numerical range. As an example, the range 10 to 15 includes, but is not limited to, 10, 10.1, 10.47, 11, 11.75 to 12.2, 12.5, 13 to 13.8, 14, 14.025, and 15.

The term "gas" herein denotes any gas or mixture thereof applicable to a conventional package process.

The term "chip" herein denotes any type of chips applicable to a conventional package process.

The invention will be illustrated in detail by reference to some embodiments as depicted in appended drawings. Numerous details are described below to provide a full comprehension of the invention. However, the invention can be implemented without some or all of these specific details. In addition, well-known processing steps and/or structures are not further described here so as not to make a person with ordinary knowledge in the art unnecessarily confused about the invention.

Embodiments of a chip pressing device of the invention are illustrated below by reference to the appended drawings.

Figure 1:
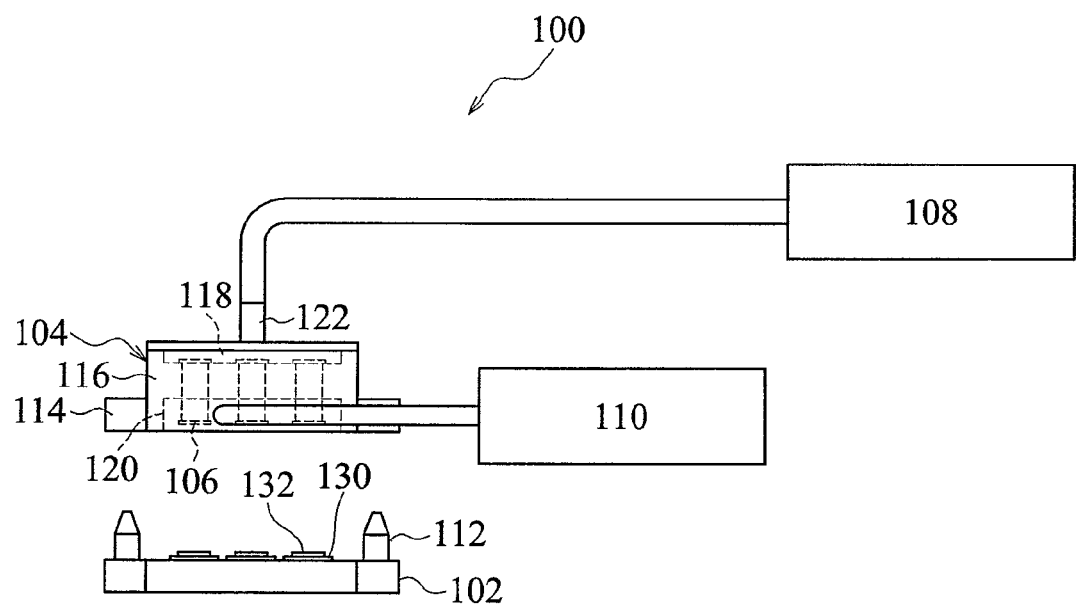
FIG. 1 shows a schematic side view of a chip pressing device according to one embodiment of the invention.
Figure 2:
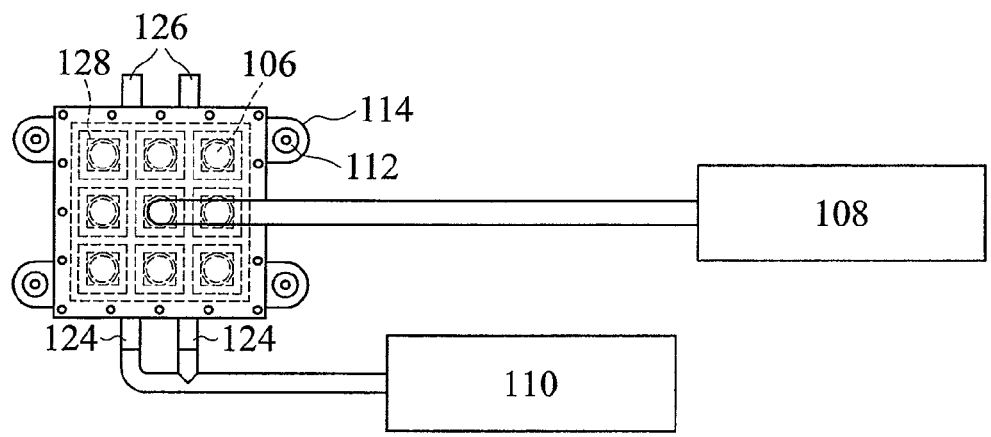
FIG. 2 shows a schematic top view of the chip pressing device depicted in FIG. 1.

FIG. 1 shows a schematic side view of a chip pressing device 100 according one embodiment of the invention. FIG. 2 shows a schematic top view of the chip pressing device 100 of FIG. 1. The chip pressing device 100 comprises: a bottom portion 102, a top portion 104, one or more pressing heads 106, a gas pressure source 108, and a heating gas source 110. In the embodiment depicted in FIG. 1, the bottom portion 102 can accommodate a carrier 130 carrying a chip 132, and the top portion 104 can be separated from or attached to the bottom portion 102. The bottom portion 102 can have a first locating portion 112, and the top portion 104 can have a second locating portion 114, which matches the first locating portion 112. Matching the first locating portion 112 of the bottom portion 102 and the second locating portion 114 of the top portion 104 can facilitate location between the top portion 104 and the bottom portion 102. The first locating portion 112 and the second locating portion 114 can be any locating devices or structures, which can match each other and is well-known to one with ordinary knowledge in the art. In the embodiment of FIG. 1, for example, the first locating portion 112 is a locating post, and the second locating portion 114 is a locating hole; however, the invention is not limited to this configuration. In an example, for instance, the first locating portion 112 can be a locating hole, and the second locating portion 114 can be a locating post.

Referring to FIG. 1 and FIG. 2, the top portion 104 has a compartment portion 116, an upper chamber 118, and a lower chamber 120, wherein the upper portion 118 is spaced apart from the lower chamber 120 by the compartment portion 116. The upper chamber 118 has a gas passage 122. The lower chamber 120 has a gas inlet 124 and a gas outlet 126. Besides, the compartment portion 116 has a through-hole 128, and the pressing head 106 can movably fit into the through-hole 128. Additionally, when the bottom portion 102 and the top portion 104 are engaged with each other, the lower chamber 120 of the top portion 104 can be tightly attached to the bottom portion 102 to form an enclosed space.

Still referring to FIG. 1 and FIG. 2, the gas pressure source 108 is connected to the gas passage 122 of the upper chamber 118, wherein the upper chamber 118 is pressurized through the gas passage 122 connected to the gas pressure source 108. The pressing head 106 movably fits into the through-hole 128 while pressurizing the upper chamber 118, so the pressing head 106, pushed by the pressure inside the upper chamber 118, moves downward and further applies pressure to the chip 132 which the pressing head 106 contacts, thereby pressing the chip 132 tightly to the carrier 130. Although only one gas passage 122 and one gas pressure source 108 are depicted in the drawings, the invention is not limited to the configuration. For example, multiple gas passages 122 and/or multiple gas pressure sources 108 can be provided as required by the process. In one example, for instance but not limited to, one gas passage 122 can be connected to a plurality of gas pressure sources 108; in another example, one gas pressure source 108 can be connected to a plurality of gas passages 122.

Still referring to FIG. 1 and FIG. 2, the heating gas source 110 is connected to the gas inlet 124 of the lower chamber 120, so as to introduce heating gas from the heating gas source 110 into the lower chamber 120 and recycle the heating gas via the gas outlet 126; thereby the temperature in the lower chamber 120 can rapidly achieve a predetermined temperature through thermal convection of the heating gas to facilitate heating the adhesive between the chip 132 and the carrier 130. Combining this configuration of the heating gas with the above pressurization of the upper chamber 118, the pressing effect between the chip 132 and the carrier 130 can be further improved. Although only one heating gas source 110, two gas inlets 124, and two gas outlets 126 are depicted in the drawings, one or more heating gas sources, one or more gas inlets 124, and one or more gas outlets can be actually provided.

The invention can achieve an effect of pressing a plurality of chips simultaneously and fast by controlling gas temperature and gas pressure, so as to enhance throughput and reduce cost for process equipment.

Figure 3:
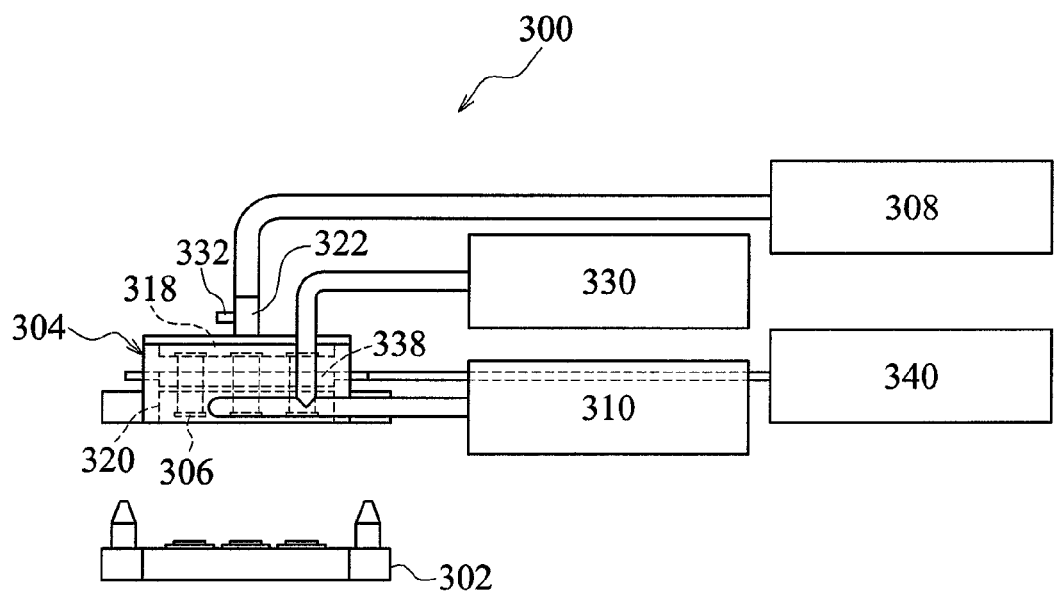
FIG. 3 shows a schematic side view of a chip pressing device according to another embodiment of the invention.
Figure 4:
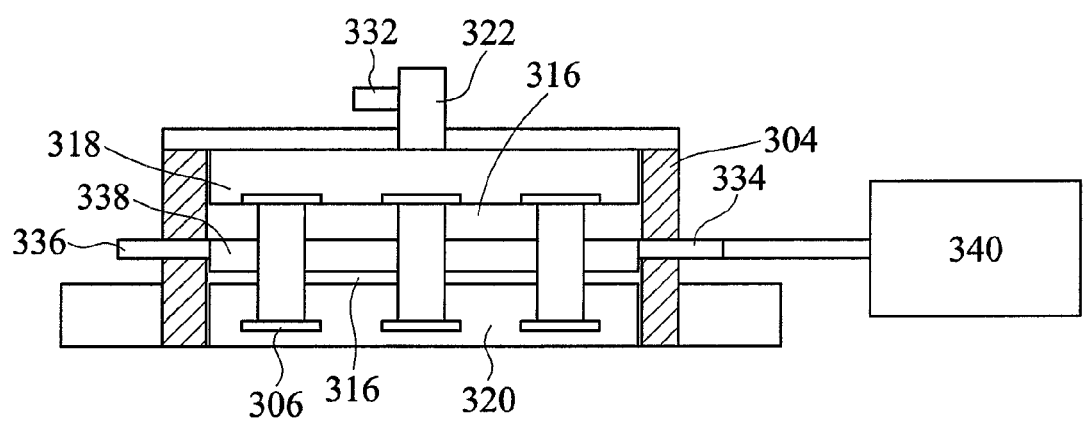
FIG. 4 shows a schematic side cross-sectional view of the top portion of the chip pressing device depicted in FIG. 3.

FIG. 3 shows a schematic side view of a chip pressing device 300 according another embodiment of the invention. FIG. 4 shows a schematic side cross-sectional view of a top portion 304 of the chip pressing device 300 in FIG. 3. The chip pressing device 300 comprises: a bottom portion 302, a top portion 304, a pressing head 306, a gas pressure source 308, and a heating gas source 310. The chip pressing device 300 shown in FIG. 3 is approximately similar to the chip pressing device 100 shown in FIG. 1. Hence, similar components and configuration are not further redundantly described below, and only the different components and corresponding configuration thereof will be illustrated.

Referring to FIG. 3 and FIG. 4, the chip pressing device 300 further comprises a cooling gas source 330, which is also connected to the gas inlet of the lower chamber 320. Cooling gas is introduced into the lower chamber 320 through the cooling gas source 330 to cool the chip and the carrier. Although only one cooling gas source 330 is depicted in the drawings, multiple cooling gas sources 330 can be actually disposed as required by the process.

Although not depicted in the drawings, in another embodiment of the invention, the gas pressure source 308 is not only connected to the upper chamber 318, but also connected to the gas inlet of the lower chamber 320, so as to supply pressurized gas into the lower chamber 320 to maintain the pressure of the lower chamber 320 in a desired state.

Still referring to FIG. 3 and FIG. 4, in the top portion 304, a gas passage 322 of the upper chamber 318 can have one or more gas outlets 332, which can be connected to a switch or a control valve (not shown). The switch or control valve, connected to the gas outlet 332, is turned off while pressurizing the upper chamber 318, and the switch or control valve is turned on while depressurizing the upper chamber 318.

Still referring to FIG. 3 and FIG. 4, in the top portion 304, a compartment portion 316 comprises one or more compartment chambers 338 having at least one gas inlet 334 and at least one gas outlet 336. For example, the gas inlet 334 of the compartment chamber 338 can be connected to one or more cooling gas sources 340, so as to introduce cooling gas into the compartment chamber 338 to reduce the temperature of the pressing head 306, thereby improving lifespan and stability of the through-hole location of the compartment portion 316.

Figure 5:
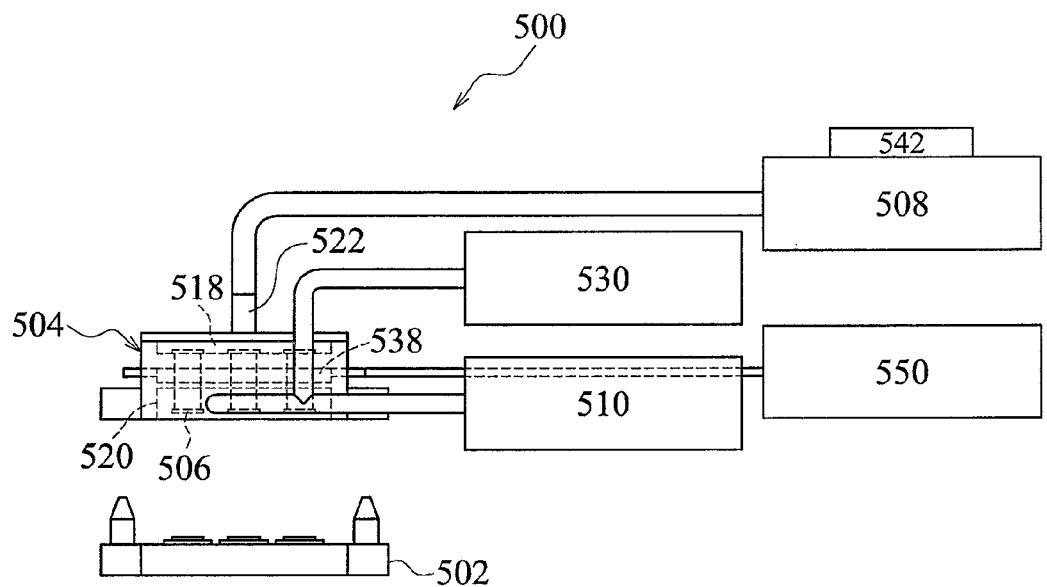
FIG. 5 shows a schematic side view of a chip pressing device according to yet another embodiment of the invention.
Figure 6:
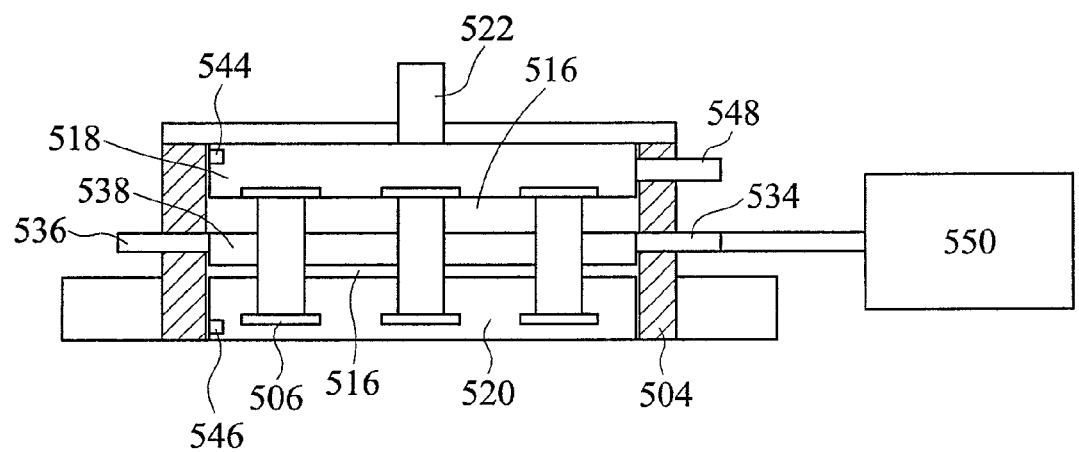
FIG. 6 shows a schematic side cross-sectional view of the top portion of the chip pressing device depicted in FIG. 5.

FIG. 5 shows a schematic side view of a chip pressing device 500 according to yet another embodiment of the invention. FIG. 6 shows a schematic side cross-sectional view of a top portion 504 of the chip pressing device 500 depicted in FIG. 5. The chip pressing device 500 comprises: a bottom portion 502, a top portion 504, a pressing head 506, a gas pressure source 508, and a heating gas source 510. The chip pressing device 500 shown in FIG. 5 is approximately similar to the chip pressing device 300 shown in FIG. 3. Hence, similar components and configuration are not further redundantly described below, and only the different components and corresponding configuration thereof will be illustrated.

In the embodiment exemplified in FIG. 5, a gas pressure source 508 is provided with a heater 542. The heater 542 can be used for heating the pressurized gas inside the gas pressure source 508 to a predetermined temperature, which can, for example, range from about 40° C. to about 800° C.

Referring to FIG. 5 and FIG. 6, the chip pressing device 500 can further comprises one or more pressure sensors 544. The pressure sensor 544 can be disposed inside the upper chamber 518 to monitor the pressure in the upper chamber 518. Besides, the pressure sensor 544 can transmit detection signals to the gas pressure source 508, so that gas supply from the gas pressure source 508 to the upper chamber 518 can be controlled.

Still referring to FIG. 5 and FIG. 6, the chip pressing device 500 further comprises one or more temperature sensors 546. The temperature sensor 546 can be disposed inside the lower chamber 520 to monitor the temperature in the lower chamber 520. In addition, the temperature sensor 546 can transmit detection signals to the heating gas source 510 and/or a cooling gas source 530 connected to the gas inlet of the lower chamber 520, so that gas supply from the heating gas source 510 and/or the cooling gas source 530 to the lower chamber 520 can be controlled.

Obviously, the aforementioned pressure sensor and temperature sensor can also be applied to other embodiments of the invention, such as the chip pressing device in FIG. 1 and FIG. 3.

Still referring to FIG. 5 and FIG. 6, in the top portion 504, the top chamber 518 has one or more gas outlets 548, which can be connected to a switch or a control valve (not shown). The switch or control valve, connected to the gas outlet 548, is turned off while pressurizing the upper chamber 518, and the switch or control valve is turned on while depressurizing the upper chamber 518. Obviously, the gas passage 522 of the upper chamber 518 in FIG. 6 can have one or more gas outlets as the gas passage 322 in FIG. 4, so the gas outlet 548 of the upper chamber 518 and/or the gas outlet of the gas passage 522 can be used for depressurizing the upper chamber 518.

Still referring to FIG. 5 and FIG. 6, in the top portion 504, a compartment portion 516 comprises one or more compartment chambers 538 having at least one gas inlet 534 and at least one gas outlet 536. In the embodiment described in FIG. 5 and FIG. 6, the compartment chamber 538 is connected to a vacuum source 550 to maintain the compartment chamber 538 in a vacuum state below 1 atm, thereby accomplishing a heat-insulating effect to reduce the temperature of the pressing head 506 and thus improve lifespan and stability of the through-hole location of the compartment portion 516. In one embodiment of the invention, the compartment chamber can be connected to both of the vacuum source and the cooling gas source to provide various process options.

In embodiments of the invention, the gas pressure source can be a constant gas pressure source to supply a constant pressure to the upper chamber. Alternatively, the gas pressure source can be an adjustable gas pressure source to adjust the pressure of the upper chamber depending on diverse conditions. The gas pressure source herein can provide a pressure ranging from 1 atm to 50 atm.

In embodiments of the invention, the heating gas source can be a constant pressure heating gas source or an adjustable pressure heating gas source to provide a heating gas with a predetermined pressure, which can range from 1 atm to 50 atm.

Embodiments of the chip pressing method of the invention are illustrated below by reference to appended drawings.

Figure 7:
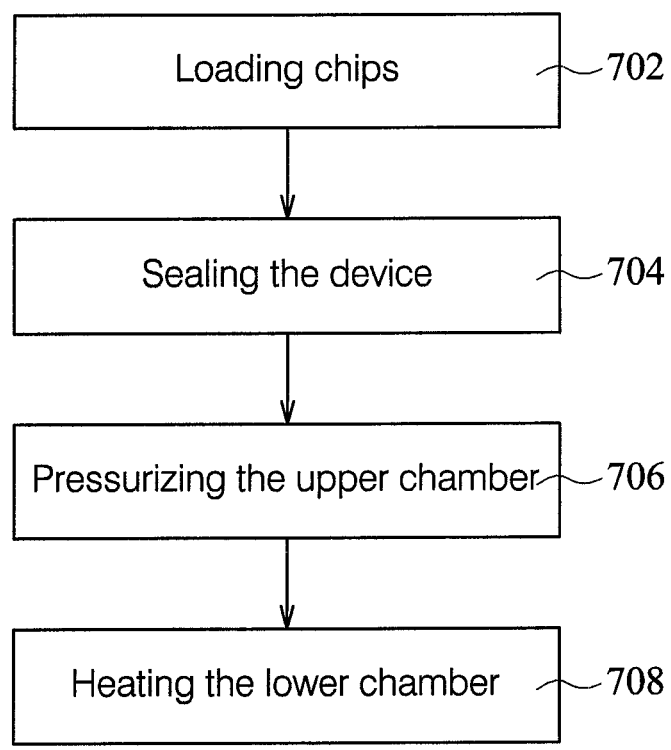
FIG. 7 is a flow chart of the chip pressing method according to one embodiment of the invention.

FIG. 7 is a flow chart 700 of the chip pressing method according to one embodiment of the invention. The chip pressing method utilizes the chip pressing devices described above. As described in FIG. 7, the flow chart 700 comprises the following steps: a step 702, of loading chips, a step 704 of sealing the device, a step 706 of pressurizing the upper chamber, and a step 708 of heating the lower chamber.

In step 702, a carrier carrying one or more chips is placed on the bottom portion of the chip pressing device.

In step 704, the bottom portion and the top portion are engaged with each other to make the pressing head contact the chip on the carrier. In one embodiment of the invention, before the pressing head contacts the chip, pressurized gas can be introduced into the upper chamber through the gas pressure source for performing pressurization, in order to apply pressure to the pressing head to move the pressing head to a predetermined position.

In step 706, pressurized gas is introduced into the upper chamber through the gas pressure source for performing pressurization, in order to apply pressure to the pressing head to press the chip tightly to the carrier or another chip. The above pressure for pressurization can, for example, range from 1 atm to 50 atm.

In step 708, heating gas is introduced into the lower chamber through the heating gas source to heat the chip and the carrier. The temperature of the heating gas can, for example, range from 40° C. to 800° C.

A step of depressurizing the upper chamber can be further included after the step 708. For example, after heating the chip and the carrier, the upper chamber can be depressurized by using the gas outlet of the upper chamber and/or the gas outlet of the gas passage.

In embodiments of the invention, the chip pressing device can comprise one or more gas pressure sources. When the chip pressing device comprises multiple gas pressure sources, gas under different pressures can be introduced into the upper chamber through the multiple gas pressure sources respectively, so as to perform a multi-stage pressing head pressure control.

In embodiments of the invention, the chip pressing device can comprise one or more heating gas sources. When the chip pressing device comprises multiple heating gas sources, heating gas at different temperatures can be introduced into the lower chamber through the multiple heating gas sources respectively, so as to perform a multi-stage temperature heating control.

Furthermore, in embodiments of the invention, the chip pressing device can further comprise one or more cooling gas sources, connected to the gas inlet of the lower chamber. When the chip pressing device comprises multiple cooling gas sources, cooling gas at different temperatures can be introduced into the lower chamber through the multiple cooling gas sources respectively, so as to perform a multi-stage temperature cooling control.

While the present invention has been shown and described by reference to preferred embodiments thereof, and in terms of the illustrative drawings, various possible modifications, alterations, and equivalent substitution could be conceived of by one skilled in the art without departing from the spirit and the scope of the present invention. However, such modifications, alterations, and substitutions still fall within the scope of the claims of the present invention. Moreover, except that a specific order of the steps is explicitly indicated in the claims or elsewhere in this specification, the sequence of the steps is not limited to the order in which the steps are recited.

What is claimed is:

1. A chip pressing device, comprising
a bottom portion;
a top portion, which is configured to be attached to or separated from the bottom portion, and has a compartment portion, an upper chamber, and a lower chamber, wherein the upper chamber is spaced apart from the lower chamber by the compartment portion, the upper chamber having one or more gas passages, the lower chamber having one or more gas inlets and one or more gas outlets, the compartment portion having one or more through-holes;
one or more pressing heads, which is configured to movably fit into the through-hole;
one or more gas pressure sources, connected to at least one of the gas passages of the upper chamber, wherein the upper chamber is pressurized through the gas passage connected to the gas pressure source so as to push the pressing heads towards the bottom portion; and
one or more heating gas sources, connected to the one or more gas inlets of the lower chamber,
wherein when the bottom portion and the top portion are attached to each other, the bottom portion tightly seals the lower chamber of the top portion.

2. The chip pressing device of claim 1, further comprising:
one or more cooling gas sources, connected to the one or more gas inlets of the lower chamber.

3. The chip pressing device of claim 1, wherein the gas pressure source is connected to the one or more gas inlets of the lower chamber.

4. The chip pressing device of claim 1, wherein the gas passage has one or more gas outlets, and the upper chamber is depressurized through the gas outlet of the gas passage.

5. The chip pressing device of claim 1, wherein the upper chamber has one or more gas outlets, and the upper chamber is be depressurized through the gas outlet of the upper chamber.

6. The chip pressing device of claim 1, wherein the compartment portion comprises one or more compartment chambers having at least one gas inlet and at least one gas outlet.

7. The chip pressing device of claim 6, wherein the gas inlet of the compartment chamber is connected to one or more cooling gas sources.

8. The chip pressing device of claim 1, wherein the gas pressure source is a constant gas pressure source.

9. The chip pressing device of claim 1, wherein the gas pressure source is an adjustable gas pressure source.

10. The chip pressing device of claim 1, further comprising:
one or more pressure sensors, which are disposed in the upper chamber.

11. The chip pressing device of claim 10, wherein the one or more pressure sensors are configured to transmit detection signals to the gas pressure source.

12. The chip pressing device of claim 1, further comprising:
one or more temperature sensors, which are disposed in the lower chamber.

13. The chip pressing device of claim 12, wherein the one or more temperature sensors are configured to transmit detection signals to the heating gas source.

14. The chip pressing device of claim 1, wherein the gas pressure source is provided with a heater.

15. The chip pressing device of claim 1, wherein the heating gas source is an adjustable pressure heating gas source or a constant pressure heating gas source.

16. The chip pressing device of claim 6, further comprising:
a vacuum source, which is connected to the compartment chamber.

17. The chip pressing device of claim 1, wherein the bottom portion has a first locating portion, and the top portion has a second locating portion matching the first locating portion.

18. A chip pressing method using the chip pressing device of claim 1, the method comprising:
placing a carrier, on which one or more chips is provided, on the bottom portion of the chip pressing device;
engaging the bottom portion with the top portion of the chip pressing device to make the pressing head contact the chip on the carrier;
introducing pressurized gas into the upper chamber through the gas pressure source to perform pressurization, so as to apply pressure to the pressing head to press the chip tightly onto the carrier or another chip; and
introducing heating gas into the lower chamber through the heating gas source to heat the chip and the carrier.

19. The chip pressing method of claim 18, further comprising:
depressurizing the upper chamber after heating the chip and the carrier.

20. The chip pressing method of claim 19, wherein the gas passage of the upper chamber of the chip pressing device has one or more gas outlets, and the upper chamber is depressurized through the one or more gas outlets of the gas passage after heating the chip and the carrier.

21. The chip pressing method of claim 19, wherein the upper chamber of the chip pressing device has one or more gas outlets, and the upper chamber is depressurized through the one or more gas outlets of the upper chamber after heating the chip and the carrier.

22. The chip pressing method of claim 18, further comprising:
introducing pressurized gas into the upper chamber through the gas pressure source to perform pressurization before the pressing head contacting the chip, so as to apply pressure to the pressing head to move the pressing head to a predetermined position.

23. The chip pressing method of claim 18, wherein the chip pressing device further comprises one or more cooling gas sources connected to the one or more gas inlets of the lower chamber, wherein cooling gas is introduced into the lower chamber through the cooling gas source to cool the chip and the carrier.

24. The chip pressing method of claim 18, wherein in the step of introducing pressurized gas into the upper chamber, the pressure of pressurization ranges from 1 atm to 50 atm.

25. The chip pressing method of claim 18, wherein in the step of introducing heating gas into the lower chamber, the temperature of the heating gas ranges from 40° C. to 800° C.

26. The chip pressing method of claim 18, wherein when the chip pressing device comprises multiple heating gas sources, heating gases with different temperatures are introduced into the lower chamber through the multiple heating gas sources respectively, so as to perform a multi-stage temperature heating control.

27. The chip pressing method of claim 18, wherein when the chip pressing device comprises multiple gas pressure sources, gases with different pressures are introduced into the upper chamber through the multiple gas pressure sources respectively, so as to perform a multi-stage pressing head pressurization control.

28. The chip pressing method of claim 27, wherein the multiple gas pressure sources are adjustable gas pressure sources.

29. The chip pressing method of claim 18, wherein the gas pressure source is connected to one or more gas inlets of the lower chamber, so as to supply the pressurized gas into the lower chamber.

30. The chip pressing method of claim 18, wherein the compartment portion of the chip pressing device comprises one or more compartment chambers each having at least one gas inlet and at least one gas outlet.

31. The chip pressing method of claim 30, wherein the gas inlet of the compartment chamber is connected to one or more cooling gas sources, so as to introduce cooling gas into the compartment chamber.

32. The chip pressing method of claim 30, wherein the chip pressing device further comprises a vacuum source connected to the compartment chamber, so as to maintain the compartment chamber in a vacuum state below 1 atm.

33. The chip pressing method of claim 18, wherein the chip pressing device further comprises one or more pressure sensors, which are disposed inside the upper chamber.

34. The chip pressing method of claim 33, wherein the one or more pressure sensors are configured to transmit detection signals to the gas pressure source.

35. The chip pressing method of claim 18, wherein the chip pressing device further comprises one or more temperature sensors, which are disposed inside the lower chamber.

36. The chip pressing method of claim 35, wherein the one or more temperature sensors are configured to transmit detection signals to the heating gas source.

37. The chip pressing method of claim 18, wherein the gas pressure source is provided with a heater, whereby the pressurized gas is heated to a predetermined temperature, the predetermined temperature ranging from 40° C. to 800° C.

38. The chip pressing method of claim 18, wherein the heating gas source is an adjustable pressure heating gas source or a constant pressure heating gas source, so as to supply heating gas at a predetermined pressure, the predetermined pressure ranging from 1 atm to 50 atm.

39. The chip pressing method of claim 18, wherein the bottom portion of the chip pressing device has a first locating portion, and the top portion has a second locating portion matching the first locating portion, so as to facilitate location between the top portion and the bottom portion.

* * * * *